(12) United States Patent
Hirano

(10) Patent No.: US 8,492,067 B2
(45) Date of Patent: Jul. 23, 2013

(54) POSITIVE LIFT-OFF RESIST COMPOSITION AND PATTERNING PROCESS

(75) Inventor: Yoshinori Hirano, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/294,379

(22) Filed: Nov. 11, 2011

(65) Prior Publication Data

US 2012/0129106 A1     May 24, 2012

(30) Foreign Application Priority Data

Nov. 19, 2010   (JP) ................................ 2010-258738

(51) Int. Cl.
    *G03F 7/023*     (2006.01)
    *G03F 7/30*     (2006.01)

(52) U.S. Cl.
    CPC ............... *G03F 7/0236* (2013.01); *G03F 7/30* (2013.01)
    USPC ........... 430/191; 430/192; 430/193; 430/326; 430/330

(58) Field of Classification Search
    CPC .................................. G03F 7/0236; G03F 7/30
    USPC ......................... 430/191, 192, 193, 326, 330
    See application file for complete search history.

(56) References Cited

U.S. PATENT DOCUMENTS

| 5,773,200 | A | 6/1998 | Okazaki et al. | |
| 6,440,646 | B2 | 8/2002 | Ueda et al. | |
| 6,558,867 | B2 | 5/2003 | Noda et al. | |
| 6,773,858 | B2 | 8/2004 | Kato et al. | |
| 6,911,292 | B2 * | 6/2005 | Furihata et al. | 430/190 |
| 2004/0131963 | A1 * | 7/2004 | Ohta et al. | 430/141 |
| 2004/0131964 | A1 | 7/2004 | Furihata et al. | |

FOREIGN PATENT DOCUMENTS

| EP | 0303108 A2 | 2/1989 |
| EP | 1388759 A1 | 2/2004 |
| JP | 50-007482 B | 3/1975 |
| JP | 63-287951 A | 11/1988 |
| JP | 8-069111 A | 3/1996 |
| JP | 10-097066 A | 4/1998 |
| JP | 2001-235872 A | 8/2001 |
| JP | 2004-094229 A | 3/2004 |

OTHER PUBLICATIONS

European Search Report dated Mar. 7, 2012, issued in corresponding European Patent Application No. 11188370.8.

* cited by examiner

*Primary Examiner* — John Chu

(74) *Attorney, Agent, or Firm* — Westerman, Hattori, Daniels & Adrian, LLP

(57) ABSTRACT

A positive lift-off resist composition is provided comprising (A) an alkali-soluble novolac resin, (B) a quinonediazidosulfonate photosensitive agent, (C) an alkali-soluble cellulose resin, and (D) an aromatic hydroxy compound having a formula weight of 180-800. The composition has shelf stability, high sensitivity, and a film retention after development of at least 95% and is used to form a lift-off resist pattern of fully undercut profile.

8 Claims, 1 Drawing Sheet

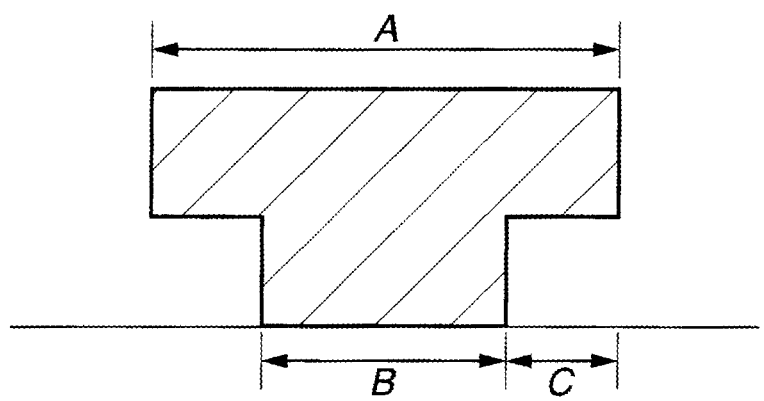

POSITIVE LIFT-OFF RESIST COMPOSITION AND PATTERNING PROCESS

CROSS-REFERENCE TO RELATED APPLICATION

This non-provisional application claims priority under 35 U.S.C. §119(a) on Patent Application No. 2010-258738 filed in Japan on Nov. 19, 2010, the entire contents of which are hereby incorporated by reference.

TECHNICAL FIELD

This invention relates to a positive lift-off resist composition and a process of forming a lift-off resist pattern.

BACKGROUND ART

The lift-off technique is known as means for forming metal wiring patterns of aluminum, copper, tantalum or the like on semiconductor substrates. The lift-off technique involves, for example, the steps of coating a resist composition on a substrate, exposing the resist film to light through a mask, developing to form a resist pattern on the substrate, depositing a metal film on the resist pattern and the substrate by sputtering or evaporation, and stripping the resist pattern and the metal film thereon together, thus leaving a metal wiring on the substrate. The resist pattern used in the lift-off technique is desired to have a profile having undercuts, also known as "microgrooves," at the bottom of the resist pattern where the resist contacts the substrate.

Prior art positive lift-off resist compositions known to form patterns of such profile are described in JP-A H08-69111 and JP-A H10-97066. These compositions use different components, but are common in that aromatic hydroxy compounds are used in order to form undercuts. This is because aromatic hydroxy compounds have an adequate alkali dissolution rate to form undercuts near the substrate and control the size thereof. Also JP-A 2001-235872 discloses means for improving the substrate adhesion of a resist. This resist material, however, suffers a film loss phenomenon that as the undercut depth increases, the resist film in the unexposed area is also developed during the development step, becoming thinner. It is difficult to provide the desired undercut depth and maintain the resist film thickness at the same time. It is desired to have a positive lift-off resist composition which ensures a sufficient undercut depth while controlling a film loss during development.

JP-A 2004-94229 discloses a positive photoresist composition comprising a polymer in the form of a novolac resin having a weight average molecular weight of 1,000 to 30,000 versus polystyrene standards in which 3 to 27 mol % of the hydroxyl group hydrogens are substituted by 1,2-naphthoquinonediazidosulfonyl groups, and an alkali-soluble cellulose resin. This composition sometimes fails to form undercuts near the substrate.

CITATION LIST

Patent Document 1: JP-A H08-69111 (U.S. Pat. No. 5,773,200)
Patent Document 2: JP-A H10-97066
Patent Document 3: JP-A 2001-235872 (U.S. Pat. No. 6,558,867)
Patent Document 4: JP-A 2004-94229 (U.S. Pat. No. 6,773,858, EP 1388759)

DISCLOSURE OF INVENTION

An object of the invention is to provide a positive lift-off resist composition having a film retention after development (film thickness after development/film thickness after softbake) of at least 95% and an undercut capability, and a pattern forming process.

The inventor has found that by combining (A) an alkali-soluble novolac resin, (B) a quinonediazidosulfonate photosensitive agent, (C) an alkali-soluble cellulose resin, and (D) an aromatic hydroxy compound having a formula weight of 180 to 800 and adjusting the amount of (C), a positive lift-off resist composition is obtained which can form satisfactory undercuts while restraining a film loss.

In one aspect, the invention provides a positive lift-off resist composition comprising (A) an alkali-soluble novolac resin, (B) a quinonediazidosulfonate photosensitive agent, (C) an alkali-soluble cellulose resin, and (D) an aromatic hydroxy compound having a formula weight of 180 to 800. The cellulose resin (C) is present in an amount of 3 to 30 parts by weight per 100 parts by weight of the novolac resin (A).

In a preferred embodiment, the quinonediazidosulfonate photosensitive agent (B) is selected from the group consisting of 2,3,4-trihydroxybenzophenone naphthoquinone-diazidosulfonate, 2,3,4,4'-tetrahydroxybenzophenone naphthoquinonediazidosulfonate, 2,2',4,4'-tetrahydroxy-benzophenone naphthoquinonediazidosulfonate, and compounds having the general formula (1) or (2), trihydroxybenzophenone, and tetrahydroxybenzophenone, in which the hydrogen atom of at least one hydroxy group is substituted by a naphthoquinonediazidosulfonyl group,

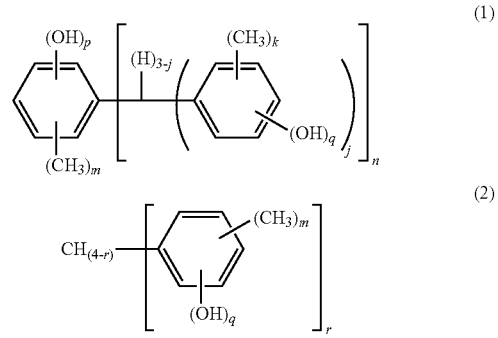

wherein j is 1 or 2, k, m, and p each are an integer of 0 to 3, n is an integer of 1 to 4, q is an integer of 1 to 3, r is 2 or 3, $m+p+n \leq 6$ and $k+q \leq 5$. The photosensitive agent (B) is present in an amount of 20 to 55 parts by weight per 100 parts by weight of the novolac resin (A).

In a preferred embodiment, the alkali-soluble cellulose resin (C) has the structural formula (3):

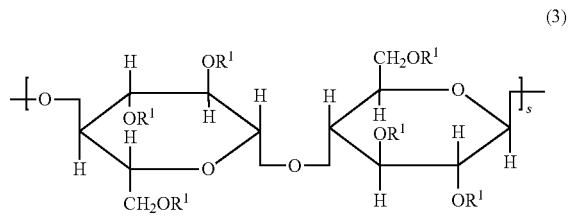

wherein $R^1$ is each independently hydrogen, $C_1$-$C_4$ alkyl, $C_1$-$C_4$ hydroxyalkyl, acyl or an organic group having the structural formula (4):

(4)

wherein R' is $C_1$-$C_6$ alkylene, phenylene or cyclohexylene, in a range providing an acid value of 30 to 150, a proportion of the organic group having formula (4) in $R^1$ being on average 2 to 30 mol % per unit glucose ring, and s is an integer of 2 to 10,000.

In a preferred embodiment, the aromatic hydroxy compound (D) is selected from compounds having the formulae (1), (2) and (5).

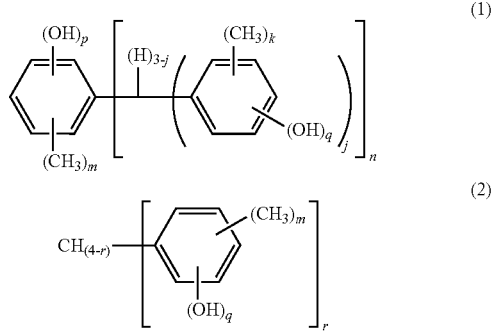
(1)

(2)

Herein j is 1 or 2, k, m, and p each are an integer of 0 to 3, n is an integer of 1 to 4, q is an integer of 1 to 3, r is 2 or 3, $m+p+n \leqq 6$ and $k+q \leqq 5$.

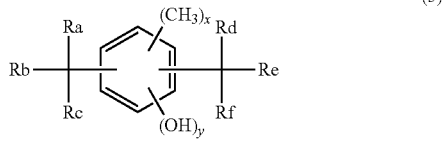
(5)

Herein Ra, Rb, Rc, Rd, Re, and Rf are each independently hydrogen, methyl, or a group having the formula (6):

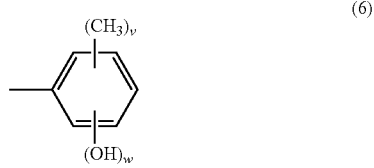
(6)

wherein v and w each are an integer of 0 to 3, at least one of Ra, Rb, and Rc and at least one of Rd, Re, and Rf have a benzene ring structure with hydroxyl added thereto, x and y each are an integer of 0 to 3. The aromatic hydroxy compound (D) is present in an amount of 2 to 70 parts by weight per 100 parts by weight of the novolac resin (A).

In another aspect, the invention provides a process for forming a pattern, comprising the steps of coating the resist composition defined herein onto a substrate and heat treating to form a resist film, exposing the resist film to radiation or electron beam through a photomask, optionally heat treating, and developing the exposed resist film with a developer.

In a further aspect, the invention provides a process for forming a pattern, comprising the steps of depositing a metal layer on the entire surface of the substrate on which the resist pattern has been formed by the above process, and stripping the resist pattern and a portion of the metal layer lying on the resist pattern, thus leaving a metal pattern on the substrate.

Advantageous Effects of Invention

The positive lift-off resist composition has a shelf stability, a high sensitivity, and a film retention after development (film thickness after development/film thickness after softbake) of at least 95%. It can be used to form a lift-off resist pattern of a fully undercut profile.

BRIEF DESCRIPTION OF DRAWING

FIG. 1 is a schematic cross-section of a resist pattern formed from the positive lift-off resist composition.

DESCRIPTION OF EMBODIMENTS

As used herein, the notation (Cn-Cm) means a group containing from n to m carbon atoms per group.

The positive lift-off resist composition is defined as comprising (A) an alkali-soluble novolac resin, (B) a quinonediazidosulfonate photosensitive agent, (C) an alkali-soluble cellulose resin, and (D) an aromatic hydroxy compound having a formula weight of 180 to 800 as essential components.

Component (A) is an alkali-soluble novolac resin which may be synthesized as the condensation reaction product of a phenol with an aldehyde. Suitable phenols include phenol, m-cresol, p-cresol, o-cresol, xylenols such as 2,3-xylenol, 2,5-xylenol, 3,5-xylenol, and 3,4-xylenol, alkylphenols such as m-ethylphenol, p-ethylphenol, and o-ethylphenol, alkoxyphenols such as p-methoxyphenol and m-methoxyphenol, isopropenylphenols such as p-isopropenylphenol and o-isopropenylphenol, and polyhydroxyphenols such as bisphenol A. These phenols may be used alone or in admixture. Inter alia, m-cresol, p-cresol, o-cresol, 2,5-xylenol, and 3,5-xylenol are preferred.

Suitable aldehydes include formaldehyde, paraformaldehyde, trioxane, acetaldehyde, propionaldehyde, butylaldehyde, trimethylacetaldehyde, acrolein, crotonaldehyde, cyclohexanaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, and p-chlorobenzaldehyde. These aldehydes may be used alone or in admixture. Inter alia, formaldehyde is most preferred for availability.

By any well-known methods, the phenol may be reacted with the aldehyde in the presence of an acidic catalyst to form a condensation reaction product. Suitable acidic catalysts include hydrochloric acid, sulfuric acid, formic acid, oxalic acid, and p-toluenesulfonic acid. From the condensation product, a low molecular fraction may be cut off by fractionation or suitable treatment, prior to use.

In the practice of the invention, preferred novolac resins are obtained from condensation of a mixture of two or more phenols selected from m-cresol, p-cresol, o-cresol, 2,5-xylenol, and 3,5-xylenol with formaldehyde. Preferred are those novolac resins having a weight average molecular weight (Mw) of 2,000 to 20,000, more preferably 2,500 to 15,000, as measured by gel permeation chromatography (GPC) using tetrahydrofuran solvent versus polystyrene standards.

Component (B) is a quinonediazidosulfonate photosensitive agent. The photosensitive agent used herein is selected from well-known naphthoquinonediazidosulfonic acid esters, for example, 2,3,4-trihydroxybenzophenone naphthoquinonediazidosulfonate, 2,3,4,4'-tetrahydroxy-benzophenone naphthoquinonediazidosulfonate, and 2,2',4,4'-tetrahydroxybenzophenone naphthoquinonediazido-sulfonate, which are commercially available, and compounds having the general formula (1) or (2), trihydroxybenzophenone, and tetrahydroxybenzophenone, in which the hydrogen atom or atoms of one or more hydroxy groups are substituted by a naphthoquinonediazidosulfonyl group or groups.

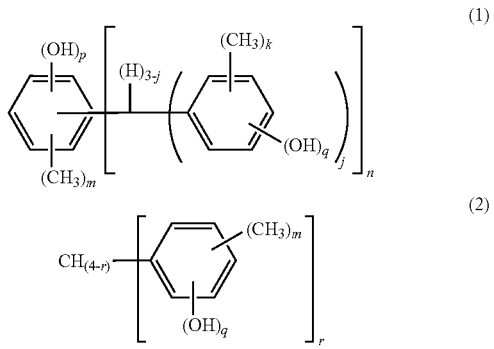

Herein j is 1 or 2, k, m, and p each are an integer of 0 to 3, n is an integer of 1 to 4, q is an integer of 1 to 3, r is 2 or 3, $m+p+n \leq 6$, and $k+q \leq 5$.

Those photosensitive agents in which at least 65 mol % of phenolic hydroxyl groups are esterified with naphthoquinonediazidosulfonic acid are preferred for lift-off pattern formation. In the practice of the invention, preferably 20 to 55 parts, more preferably 25 to 55 parts, and even more preferably 30 to 45 parts by weight of the photosensitive agent is blended per 100 parts by weight of the novolac resin (A). The photosensitive agents may be used alone or in admixture of two or more.

Component (C) is an alkali-soluble cellulose resin. Component (C) preferably comprises an alkali-soluble cellulose resin having the structural formula (3):

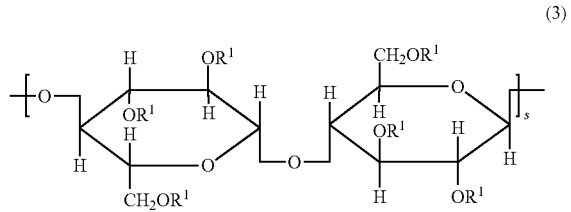

wherein $R^1$ is each independently hydrogen, $C_1$-$C_4$ alkyl, $C_1$-$C_4$ hydroxyalkyl, $C_1$-$C_8$ acyl or an organic group having the structural formula (4):

wherein R' is $C_1$-$C_6$ alkylene, phenylene or cyclohexylene, in a range providing an acid value of 30 to 150, a proportion of the organic group having formula (4) in $R^1$ being on average 2 to 30 mol % per unit glucose ring, and s is an integer of 2 to 10,000.

This alkali-soluble cellulose resin itself is hydrophobic and acid resistant because the carboxyalkyl groups introduced do not dissociate under acidic conditions, but can be dissolved in an aqueous or alkaline solution because the carboxyalkyl groups dissociate in a weakly acidic to neutral region, and thus becomes a resin binder transparent to an exposure light source. For this reason, the inclusion of the alkali-soluble cellulose resin is effective for increasing sensitivity and enlarging undercuts.

A cellulose resin of formula (3) having an acid value of less than 30 may be less effective for sensitivity improvement and undercut enlargement. If the acid value exceeds 150, the film retention after pattern formation may be reduced.

As long as the cellulose resin has an acid value of 30 to 150, $R^1$ is independently selected from among hydrogen, $C_1$-$C_4$ alkyl, $C_1$-$C_4$ hydroxyalkyl, $C_1$-$C_3$ acyl, and an organic group of the structural formula (4). The proportion of the organic group of formula (4) in $R^1$ is on average 2 to 30 mol % per unit glucose ring.

Examples of $R^1$ include hydrogen, $C_1$-$C_4$ alkyl groups such as methyl, ethyl, propyl, isopropyl, n-butyl, isobutyl, and tert-butyl, $C_1$-$C_4$ hydroxyalkyl groups such as hydroxymethyl, hydroxyethyl, and 2-hydroxypropyl, and $C_1$-$C_8$ acyl groups such as acetyl, propionyl and butyryl. In formula (4), R' is a $C_1$-$C_6$ alkylene group, such as ethylene, a phenylene group or a cyclohexylene group.

The proportion of the organic group of formula (4) in $R^1$ is on average 2 to 30 mol %, preferably 5 to 25 mol %, per unit glucose ring. If the proportion of the organic group of formula (4) is less than 2 mol %, the resin becomes less dissolvable in an alkaline solution upon development. If the proportion of the organic group of formula (4) exceeds 30 mol %, the resin becomes too much dissolvable in an alkaline solution, which becomes the cause of film loss after development. The subscript s is an integer of 2 to 10,000, preferably 100 to 5,000.

The alkali-soluble cellulose resin (C) having formula (3) is blended in an amount of 3 to 30 parts, preferably 7 to 20 parts by weight per 100 parts by weight of the alkali-soluble novolac resin (A). Less than 3 pbw of the cellulose resin is less effective for undercut enlargement, failing to form undercuts of the desired size. The composition containing more than 30 pbw of the cellulose resin is inadequate for pattern formation because of an increased solubility in aqueous alkaline solution, poor film retention, and excessively enlarged undercuts.

Component (D) is an aromatic hydroxy compound having a formula weight of 180 to 800, which serves as a dissolution accelerator along with the alkali-soluble cellulose resin (C). In the aromatic hydroxy compound, the number of benzene rings is preferably 2 to 15, more preferably 3 to 10, and even more preferably 3 to 7, and the ratio of the number of hydroxyl groups to the number of benzene rings is preferably from 0.4 to 3.0, more preferably from 0.5 to 2.0, and even more preferably from 0.6 to 1.5. A smaller number of hydroxyl groups may lead to a low rate of dissolution in alkaline developer, failing to provide the desired undercut size. A larger number of hydroxyl groups may lead to a lowering of adhesion. An aromatic hydroxy compound having a formula weight in excess of 800 achieves less of the desired effect. Specifically, when an aromatic hydroxy compound having a formula weight in excess of 800 is blended, the undercuts to be formed become smaller, failing to attain the benefits of the invention. It is acceptable that some hydroxyl groups on the aromatic hydroxy compound may be acylated. In this case, acylation may be performed by standard methods.

Preferably the aromatic hydroxy compound (D) is selected from compounds having the formulae (1), (2) and (5).

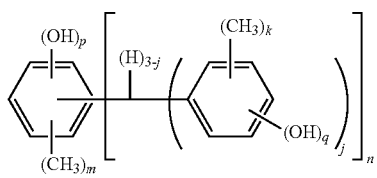

(1)

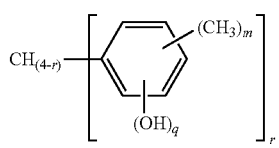

(2)

Herein j is 1 or 2, k, m, and p each are an integer of 0 to 3, n is an integer of 1 to 4, q is an integer of 1 to 3, r is 2 or 3, $m+p+n \leqq 6$ and $k+q \leqq 5$.

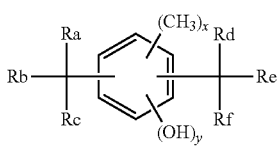

(5)

Herein Ra, Rb, Rc, Rd, Re, and Rf are each independently hydrogen, methyl, or a group having the formula (6), at least one of Ra, Rb, and Rc and at least one of Rd, Re, and Rf have a benzene ring structure with hydroxyl added thereto, x and y each are an integer of 0 to 3.

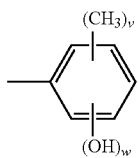

(6)

Herein v and w each are an integer of 0 to 3.

The aromatic hydroxy compounds may be used alone or in admixture of two or more. The aromatic hydroxy compound (D) is preferably blended in an amount of 2 to 70 parts, more preferably 5 to 60 parts, and even more preferably 10 to 50 parts by weight per 100 parts by weight of the novolac resin (A).

In addition to the foregoing components, a surfactant may be added to the resist composition for improving coating characteristics. Suitable surfactants include nonionic, fluorochemical and silicone surfactants. Inter alia, nonionic surfactants are preferred while they are commercially available, for example, under the trade name of Fluorad FC-430 from 3M Sumitomo Co., Ltd. and X-70-092 and X-70-093 from Shin-Etsu Chemical Co., Ltd.

In the resist composition, various additives may be added insofar as the benefits of the invention are not impaired. Suitable additives include alkali-soluble resins such as polyhydroxystyrene, azo compounds such as 2-benzeneazo-4-methylphenol and 4-hydroxy-4'-dimethyl-aminoazobenzene, dyes such as curcumin, and pigments.

In the resist composition, a solvent may be used. Suitable solvents include, but are not limited to, butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Inter alia, alkyl acetates and alkyl lactates are preferred. The solvents may be used alone or in admixture of two or more.

The solvent may be used in any suitable amount. An appropriate amount of the solvent is 100 to 9,800 parts by weight per 100 parts by weight of the novolac resin (A).

A resist pattern may be formed from the positive lift-off resist composition by any standard methods of the lift-off technique. The resist composition is applied onto a substrate of Si, $SiO_2$, SiN, SiON, TiN, WSi, BPSG or SOG, a metal substrate of Au, Ti, W, Cu, Ni—Fe, Ta, Zn, Co or Pb, or another substrate such as organic antireflective coating, by a suitable technique such as spin coating, roll coating, flow coating, dip coating, spray coating or doctor blade coating. The coating is prebaked on a hot plate at 60 to 150° C. for 1 to 10 minutes, preferably 80 to 120° C. for 1 to 5 minutes to form a resist film of the desired thickness. The resist film is then exposed to radiation such as UV, deep UV or electron beam (EB), preferably radiation with a wavelength of at least 300 nm, through a mask having the desired pattern. The exposure dose is preferably 1 to 1,000 $mJ/cm^2$, more preferably 10 to 800 $mJ/cm^2$. The resist film is baked (PEB) on a hot plate at 60 to 150° C. for 1 to 5 minutes, preferably 80 to 120° C. for 1 to 3 minutes.

Using a developer, the exposed resist film is then developed by a standard technique such as dip, puddle or spray development. A typical developer is an alkaline aqueous solution, specifically a 0.1 to 5 wt %, more specifically 2 to 3 wt % aqueous solution of tetramethylammonium hydroxide (TMAH) or the like. In this way, the desired resist pattern is formed on the substrate. Thereafter, a metal is deposited on the pattern-bearing substrate by sputtering or evaporation. The resist pattern and a portion of the metal layer lying thereon are stripped together, leaving a metal pattern or wiring on the substrate.

EXAMPLE

Synthesis Examples and Examples are given below together with Comparative Examples for illustrating the invention, but are not construed as limiting the scope of the invention thereto.

Synthesis Example 1

Synthesis of Novolac Resin

A three-necked flask equipped with a stirrer, condenser and thermometer was charged with 75.7 g (0.7 mol) of p-cresol, 32.5 g (0.3 mol) of m-cresol, 52.3 g (0.549 mol) of 37 wt % formaldehyde aqueous solution, and 0.30 g ($2.40 \times 10^{-3}$ mol)

of oxalic acid dihydrate as a polycondensation catalyst. The flask was placed in an oil bath to keep an internal temperature of 100° C., allowing polycondensation reaction to take place for one hour. At the end of reaction, 500 mL of methyl isobutyl ketone (MIBK) was added to the reaction solution, which was stirred for 30 minutes. After the water layer was taken out, the MIBK layer in which the product was extracted was washed 5 times with 300 mL of deionized water and separated therefrom. Vacuum stripping in an evaporator at 4 mmHg and 150° C. gave 87 g of a novolac resin having a weight average molecular weight (Mw) of 8,000. Note that Mw was measured by GPC using GPC columns (by Tosoh Co., Ltd., two G-2000H6, one G-3000H6, one G-4000H6) and THF eluting solvent at a flow rate of 1.5 mL/min and a column temperature of 40° C.

Examples 1 to 6 & Comparative Examples 1 to 6

The alkali-soluble novolac resin in Synthesis Example 1, 100 parts by weight, was blended with (I) a quinonediazido compound in which 66 mol % of 2,3,4-trihydroxybenzophenone was esterified with naphthoquinonediazido-5-sulfonic acid (Toyo Gosei Co., Ltd., NT-200), (II) an alkali-soluble cellulose A (Shin-Etsu Chemical Co., Ltd., hydroxypropyl methyl cellulose phthalate; acid value 92, carboxybenzoyl content 20 mol %), and (III) an aromatic hydroxy compound having formula (7) or (8) in accordance with the formulation shown in Table 1. With respect to (III), the aromatic hydroxy compound having formula (7) was used in all Examples and Comparative Examples, but the aromatic hydroxy compound having formula (8) was used in Comparative Example 6. To the blend, 0.1 part by weight of a surfactant (Shin-Etsu Chemical Co., Ltd., organosiloxane polymer X-70-093) was added for ease of coating. The blend was diluted with a solvent mixture of 85 parts by weight of ethyl lactate and 15 parts by weight of butyl acetate to form a uniform solution, which was filtered through a membrane filter with a pore size of 0.2 μm, yielding a positive lift-off resist solution.

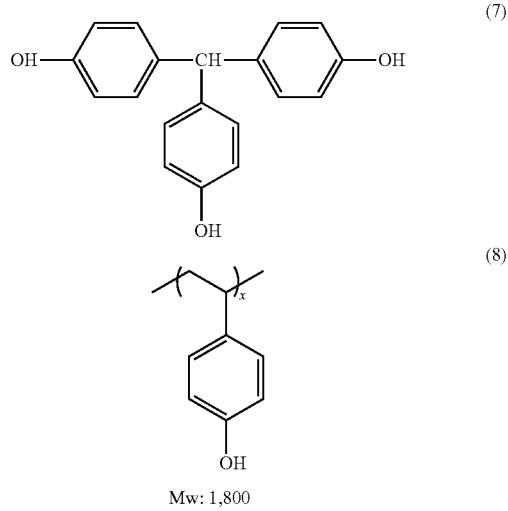

Mw: 1,800

The resist solution was coated onto a silicon substrate and soft-baked on a hot plate at 100° C. for 120 seconds to form a resist film of 3 μm thick. The resist film was exposed through a reticle by means of an i-line stepper (Nikon Corp., NA=0.5), baked (PEB) at 120° C. for 90 seconds, developed with a 2.38 wt % tetramethylammonium hydroxide (TMAH) aqueous solution for 100 seconds, rinsed with deionized water for 30 seconds, and dried. The resulting resist pattern was evaluated. The thickness of the resist film in the unexposed area was measured by a non-contact film gauge, from which a percent film retention after development was computed as (film thickness after development)/(film thickness after softbake). The optimum dose is an exposure dose that provides equal iterations of 3-μm lines and spaces. With respect to the pattern profile, a cross section of the resist pattern was observed under an electron microscope (Hitachi, Ltd.). In the cross section shown in FIG. 1, the lateral size of an undercut (one side) was measured. The results are shown in Table 2.

In FIG. 1, a T-shaped line on a substrate has a top width A and a bottom width B in contact with the substrate and one undercut has a width C. That is, A=B+2C. From the relevant portion seen in the SEM image, the values of A, B, and C were measured, the lateral size of an undercut corresponding to C.

TABLE 1

|  | Compound I Addition amount (pbw) | Compound II Addition amount (pbw) | Compound III Addition amount (pbw) | Solvent Addition amount (pbw) |
| --- | --- | --- | --- | --- |
| Example 1 | 40 | 20 | 10 | 420 |
| Example 2 | 40 | 20 | 35 | 420 |
| Example 3 | 40 | 10 | 30 | 420 |
| Example 4 | 30 | 20 | 10 | 420 |
| Example 5 | 30 | 15 | 25 | 420 |
| Example 6 | 30 | 10 | 40 | 420 |
| Comparative Example 1 | 40 | — | 35 | 400 |
| Comparative Example 2 | 40 | — | 70 | 400 |
| Comparative Example 3 | 40 | 2 | 35 | 400 |
| Comparative Example 4 | 40 | 40 | 30 | 420 |
| Comparative Example 5 | 40 | 20 | — | 420 |
| Comparative Example 6 | 40 | 20 | 20* | 420 |

*The aromatic hydroxy compound having formula (8) was used in Comparative Example 6.

TABLE 2

|  | Film retention (%) | Optimum dose (mJ/cm²) | Lateral size of undercut (μm) |
| --- | --- | --- | --- |
| Example 1 | 99 | 290 | 0.96 |
| Example 2 | 99 | 260 | 1.03 |
| Example 3 | 100 | 280 | 0.92 |
| Example 4 | 98 | 230 | 1.00 |
| Example 5 | 99 | 210 | 0.97 |
| Example 6 | 99 | 200 | 0.94 |
| Comparative Example 1 | 99 | 300 | 0.61 |
| Comparative Example 2 | 75 | 270 | 0.81 |
| Comparative Example 3 | 100 | 290 | 0.65 |
| Comparative Example 4 | 90 | pattern collapse | pattern collapse |
| Comparative Example 5 | 98 | 360 | no undercut |
| Comparative Example 6 | 98 | 340 | 0.25 |

It is demonstrated that the resist composition of the invention has a high sensitivity and a film retention after development (film thickness after development/film thickness after softbake) of at least 95%. It can be used to form a lift-off pattern with a fully undercut profile.

Japanese Patent Application No. 2010-258738 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive lift-off resist composition comprising
   (A) an alkali-soluble novolac resin,
   (B) a quinonediazidosulfonate photosensitive agent,
   (C) an alkali-soluble cellulose resin, and
   (D) an aromatic hydroxy compound having a formula weight of 180 to 800,
   wherein the cellulose resin (C) is present in an amount of 3 to 30 parts by weight per 100 parts by weight of the novolac resin (A).

2. The resist composition of claim 1 wherein the quinonediazidosulfonate photosensitive agent (B) is selected from the group consisting of 2,3,4-trihydroxybenzophenone naphthoquinonediazidosulfonate, 2,3,4,4'-tetrahydroxybenzophenone naphthaquinonediazido-sulfonate, 2,2',4,4'-tetrahydroxybenzophenone naphthoquinonediazidosulfonate, and compounds having the general formula (1) or (2), trihydroxybenzophenone, and tetrahydroxybenzophenone, in which the hydrogen atom of at least one hydroxy group is substituted by a naphthoquinonediazidosulfonyl group,

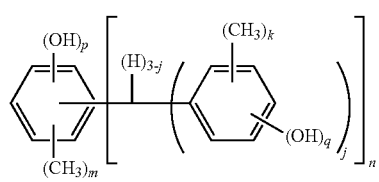

(1)

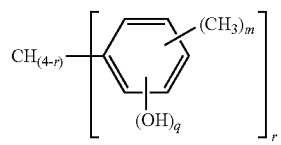

(2)

wherein j is 1 or 2, k, m, and p each are an integer of 0 to 3, n is an integer of 1 to 4, q is an integer of 1 to 3, r is 2 or 3, m+p+n≦6 and k+q≦5, and
   the photosensitive agent (B) is present in an amount of 20 to 55 parts by weight per 100 parts by weight of the novolac resin (A).

3. The resist composition of claim 1 wherein the alkali-soluble cellulose resin (C) has the structural formula (3):

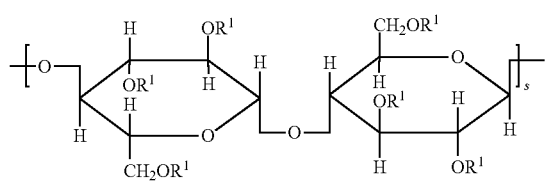

(3)

wherein $R^1$ is each independently hydrogen, $C_1$-$C_4$ alkyl, $C_1$-$C_4$ hydroxyalkyl, $C_1$-$C_8$ acyl or an organic group having the structural formula (4):

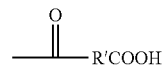

(4)

wherein R' is $C_1$-$C_6$ alkylene, phenylene or cyclohexylene, in a range providing an acid value of 30 to 150, a proportion of the organic group having formula (4) in $R^1$ being on average 2 to 30 mol % per unit glucose ring, and s is an integer of 2 to 10,000.

4. The resist composition of claim 1 wherein the aromatic hydroxy compound (D) is selected from compounds having the formulae (1), (2) and (5):

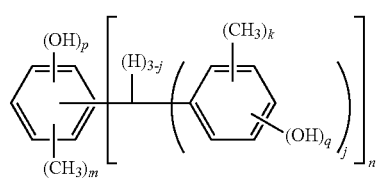

(1)

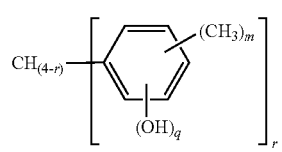

(2)

wherein j is 1 or 2, k, m, and p each are an integer of 0 to 3, n is an integer of 1 to 4, q is an integer of 1 to 3, r is 2 or 3, m+p+n≦6 and k+q≦5,

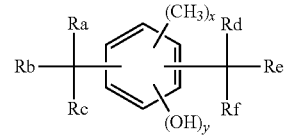

(5)

wherein Ra, Rb, Rc, Rd, Re, and Rf are each independently hydrogen, methyl, or a group having the formula (6):

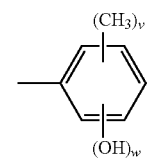

(6)

wherein v and w each are an integer of 0 to 3, at least one of Ra, Rb, and Rc and at least one of Rd, Re, and Rf have a benzene ring structure with hydroxyl added thereto, x and y each are an integer of 0 to 3, and
   the aromatic hydroxy compound (D) is present in an amount of 2 to 70 parts by weight per 100 parts by weight of the novolac resin (A).

5. A process for forming a pattern, comprising the steps of coating the resist composition of claim 1 onto a substrate and heat treating to form a resist film, exposing the resist film to radiation or electron beam through a photomask, optionally heat treating, and developing the exposed resist film with a developer.

6. A process for forming a pattern, comprising the steps of depositing a metal layer on the entire surface of the substrate on which the resist pattern has been formed by the process of claim 5, and stripping the resist pattern and a portion of the metal layer lying on the resist pattern, thus leaving a metal pattern on the substrate.

7. The resist composition of claim 1 wherein a film retention after development is at least 95%.

8. The resist composition of claim 2 wherein the hydrogen atom of at least one hydroxy group is substituted by a naphthoquinonediazidosulfonyl group so that at least 65 mol % of phenolic hydroxyl groups are esterized with naphthoquinonediazidosulfonic acid.

\* \* \* \* \*